US006475622B2

(12) United States Patent
Namiki (10) Patent No.: US 6,475,622 B2
(45) Date of Patent: Nov. 5, 2002

(54) PROCESS FOR FORMING SILICON OXIDE COATING ON PLASTIC MATERIAL

(75) Inventor: Tsunehisa Namiki, Ayase (JP)

(73) Assignee: Toyo Seikan Kaisha Ltd., Tokyo (JP)

( * ) Notice: Subject to any disclaimer, the term of this patent is extended or adjusted under 35 U.S.C. 154(b) by 0 days.

(21) Appl. No.: 09/880,135

(22) Filed: Jun. 14, 2001

(65) Prior Publication Data

US 2002/0058115 A1 May 16, 2002

Related U.S. Application Data

(63) Continuation of application No. 08/575,618, filed on Dec. 20, 1995, now Pat. No. 6,254,983.

(30) Foreign Application Priority Data

Dec. 26, 1994 (JP) ............................................... 6-340800

(51) Int. Cl.$^7$ .......................... B32B 27/36; B32B 27/32
(52) U.S. Cl. ...................... 428/412; 428/215; 428/216; 428/336; 428/448; 428/451
(58) Field of Search ................................. 428/215, 216, 428/336, 412, 446, 451, 448, 480

(56) References Cited

U.S. PATENT DOCUMENTS

| 3,991,234 A | 11/1976 | Chang et al. ................ 427/164 |
| 5,364,666 A | 11/1994 | Williams et al. ............. 427/579 |
| 5,641,559 A * | 6/1997 | Namiki ....................... 428/216 |

FOREIGN PATENT DOCUMENTS

| CA | A 2082024 | 5/1993 |
| EP | A 0 566 053 | 10/1993 |
| FR | A 2 683 230 | 5/1993 |
| JP | A 03 004870 | 1/1991 |
| WO | WO A 94 00247 | 1/1994 |

OTHER PUBLICATIONS

Outlaw, R. A. and F.A. Kern *Introduction to Total—and Partial—Pressure Measurements in Vacuum Systems.* NASA Reference Publication 1219, Nov. 1989, pp. 7, 8 and 40.
Roth, A. *Vacuum Technology.* 3$^{rd}$ Edition Elsevier, 1990, pp. 311–319.
Delchar, T.A. *Vacuum Physicsa and Techniques.* Chapman & Hall, 1993, pp. 127–130.

* cited by examiner

Primary Examiner—D. S. Nakarani
(74) Attorney, Agent, or Firm—Rader, Fishman & Grauer PLLC (57) ABSTRACT

A gas-impermeable plastic vessel and a process for forming a film having uniform thickness and high gas-interception to a plastic vessel is disclosed. The plastic vessel, having a Tg higher than the coating temperature, excellent in gas-interception, is coated with a silicon oxide film having a refractive index of 1.4 to 1.5, a thickness of 300 Å to 2000 Å and composition of $SiO_x$ (X=1.5 to 2.0). A high-frequency electrode is placed on the non-coated surface side a constant distance of not more than 10 mm from the electrode surface to the vessel surface. A ground electrode connection is placed in the coated surface side and the ground connection electrode is maintained a constant distance from the electrode surface to the vessel surface, which distance is greater than the distance from the high-frequency electrode surface to the vessel surface on which the coating is formed. A silicon oxide film having a uniform thickness is coated onto the surface which faces to the ground connection electrode by introducing plasma of the silicon oxide produced by CVD process in between the vessel and the ground connection electrode with a discharge having a pressure of 0.0005 to 0.05 torr.

6 Claims, 5 Drawing Sheets

PROCESS FOR FORMING SILICON OXIDE COATING ON PLASTIC MATERIAL

This case is a continuation of U.S. patent application Ser. No. 08/575,618 filed Dec. 20, 1995, now U.S. Pat. No. 6,254,983.

BACKGROUND OF THE INVENTION

The present invention relates to a three-dimensional plastic vessel that has excellent in gas-impermeability and suitable for packaging and other purposes, and relates to a process for coating a transparent silicon compound film that is excellent in gas-impermeability on a vessel made of a plastic material.

Packaging materials are required to prevent permeation or transmission of gas for protection and preservation of the contents. Many attempts have been made to achieve this requirement. For example, efforts for providing inorganic layers such as silicon oxide or aluminum oxide, lamination of gas-impermeable resinous layers such as polyvinylidene chloride, and lamination of metallic aluminum foil have been made.

In addition, Japanese Laid-Open Patent No. 3-183759/1991 discloses a film layer, in which an organic thin layer is formed as a coating to a plastic film by applying the synthetic resin the same as the plastic by means of vacuum deposition or sputtering, and an inorganic material is deposited in vacuum thereon to form a mixed layer of the organic and inorganic layers on which further inorganic layer is formed. Since such plastic is quite different from the inorganic layer of the coating layer and has poor affinity, the intermediate blended layer of the synthetic resin and the inorganic material is provided; however, the presence of the synthetic resin surface in the blended layer in addition to the inorganic material does not give the improvement of the fixation of the inorganic material as expected.

Furthermore, the two-step vapor deposition of the synthetic resin and inorganic material cannot be applicable to molded products for example except sheet-form materials.

Furthermore, the molecular weight of the synthetic resin is decreased by the vapor deposition; thereby, the vessel comprising this plastic material has poor processability.

The present inventor previously filed patent applications for Japanese Laid-Open Patent No. 5-345385/1993 and Japanese Patent Application No. 5-224903/1993. These inventions are quite different from conventional packaging materials overcoming defects of conventional packaging materials. However, they are not satisfactory to a certain extent in formation of coated films of ultraprecise uniform thickness although coated films of uniform thickness can be formed for three-dimensional vessels. Ultraprecise uniform thickness is required for special uses such as for packaging special drugs.

SUMMARY OF THE INVENTION

The object of the present invention is to form a film of ultraprecise thickness in which the difference of the film thickness is not more than 200 Å for example, overcomes the problem of nonuniformity in film thickness as mentioned above, and improves the gas-impermeability significantly.

DETAILED DESCRIPTION OF THE INVENTION

The present invention relates to a plastic vessel of three-dimensional shape, excellent in gas-impermeability, that is coated with a silicon oxide film, wherein the plastic can be a material that has a Tg higher than the coating temperature; and the silicon oxide film can have a refractive index of, preferably, 1.4 to 1.5, a thickness of, preferably, 300 to 2000 Å, and a composition of $SiO_x$ (preferably x=1.5 to 2.0).

In another aspect, the invention relates to a plastic vessel of three-dimensional shape, excellent in gas-interception, that is coated with a silicon oxide film, wherein the plastic can be a material that has a Tg higher than the coating temperature; and the silicon oxide film can have, preferably, a refractive index of 1.4 to 1.5, a thickness of 300 to 2000 Å and a composition of $SiO_x$ (preferably x=1.5 to 2.0), and can be coated on a polymeric film of a silicon compound that has, preferably, a refractive index of 2.0 to 2.3 and a thickness of 50 to 500 Å. Examples of plastic material can be a polyester resin such as PET or PEN, polycarbonate, or a cyclic olefin copolymer. According to the invention the silicon oxide film can be formed by the well known CVD process. Also, the silicon oxide film can be formed by the well known PVD process. Still further, the silicon oxide film can be formed by the PVD process using a mixture of silicon monoxide and silicon dioxide. Typically, the silicon oxide film can be a film that contains not less than 60% of silicon oxide compounds.

The plastic used for the vessel or container can be a material that has a Tg higher than the coating temperature of the silicon oxide film. The process can be carried out by a method wherein a high-frequency electrode is placed in the surface side on which the coating is not formed and the location of the high-frequency electrode is nearly constant in a distance not more than 10 mm from the electrode surface to the vessel surface on which the coating is formed; an electrode for ground connection is placed in the surface side on which the coating is formed and the location of the ground connection electrode is nearly constant in a distance from the ground connection electrode surface to the vessel surface, which distance is greater than the distance from the high-frequency electrode surface to the vessel surface on which the coating is formed; and then the silicon oxide film is coated in a uniform thickness to the surface which faces to the ground connection electrode by introducing the plasma of the silicon oxide produced by CVD process in between the surface of the vessel and the ground connection electrode with a discharge gas pressure of 0.0005 to 0.05 torr. Typically, the distance from the ground connection electrode surface to the vessel surface can be nearly constant and can be 11 to 100 mm.

The ground connection electrode can be one electrode that has the surface, facing with the coated surface of the vessel, of similar shape to the coated surface of the vessel. Also, the high-frequency electrode can be one electrode that has the surface of similar shape to the coated surface of the vessel.

The silicon oxide film formed on the three-dimensional plastic vessel can be a refractive index of 1.4 to 1.5 and a thickness of 300 to 2000 Å.

In another aspect, the process of the invention may include the steps wherein a high-frequency electrode is placed in the surface side on which the coating is not formed and the location of the high-frequency electrode is nearly constant in a distance, preferably, not more than 10 mm from the electrode surface to the vessel surface on which the coating is formed; an electrode for ground connection can be placed in the surface side on which the coating can be formed and the location of the ground connection electrode can be nearly constant in a distance from the ground connection electrode surface to the vessel surface, which distance is greater than the distance from the high-frequency electrode surface to the vessel surface on which the coating is formed; the polymeric film of the silicon compound can be formed on the vessel surface by introducing the plasma, which is formed by a low temperature plasma technique from an organic silicon compound comprising at least silicon, oxygen and carbon, in between the vessel surface and the ground connection electrode with a discharge gas pressure of, preferably, $3\times10^{-3}$ to $3\times10^{-2}$ torr; and the plasma of the silicon oxide produced by CVD process can be then supplied to form a coating film of the silicon oxide onto the silicon compound film with a discharge gas pressure of, preferably, 0.0005 to 0.05 torr.

The coated film of the polymeric silicon compound can have a refractive index of 2.0 to 2.3 and a thickness of 50 Å to 500 Å, and the coated film of the silicon oxide can have a refractive index of 1.4 to 1.5 and a thickness of 300 Å to 2000 Å.

A feature of the present invention resides in that an external electrode can be placed outside the three-dimensional vessel; the distance from the outer surface of the vessel to the external electrode surface can be kept nearly constant; and an internal electrode can be placed inside the vessel with a nearly constant distance from the inner surface of the vessel to the electrode surface. Furthermore, it can be characteristic that the distance from the outer surface of the vessel to the external electrode surface is not more than 10 mm when the film is coated on the inner surface of vessel, and that the distance from the outer surface of vessel to the inner electrode surface can be not more than 10 mm when the thin film is coated on the outer surface of vessel. The object of keeping a constant distance between the electrode and vessel surface is to make the electric field intensity distribution constant. The distance from the high-frequency electrode to the vessel surface on which the coating is provided can be not more than 10 mm, because the longer distance can result in an undesirable sudden decrease of the gas-impermeability. The distance between the ground connection electrode and the vessel surface to be coated can be preferably longer than the distance between the vessel surface to be coated and the high-frequency electrode. When the distance between the vessel surface to be coated and the high-frequency electrode is equal to the distance between the vessel surface to be coated and the ground connection electrode, stable discharge desired is less obtainable. Under the conditions of the present invention, the discharge occurs on the side where the distance between the electrode and the vessel surface is longer. Hence, the distance between the vessel surface and the ground connection electrode is made longer so that the discharge occurs therebetween to form the coating film. The distance between the ground connection electrode and the vessel surface is preferably 11 to 100 mm, more preferably 11 to 70 mm.

Another characteristic of the present invention is to use one ground connection electrode and one high-frequency electrode; the combination of such electrodes produces exactly constant electric field intensity distribution and makes the coated film too be formed uniform.

A third characteristic of the present invention is to produce a plasma of silicon oxide by the CVD process with a discharge gas pressure of preferably 0.0005 to 0.05 torr. When the discharge gas pressure is not higher than 0.0005 torr, the rate of filmmaking tends to be extremely reduced and filmmaking is practically very difficult or sometimes impossible. When the gas pressure is not less than 0.05 torr, the coated film can have a problem in that the gas-impermeability is suddenly deteriorated.

A fourth characteristic of the present invention is to use a plastic vessel, to be coated, that has a Tg higher than the coating temperature of the silicon oxide film, because deformation during the film forming should be avoided for the purpose of forming an ultraprecise film.

These characteristics from first to fourth can be combined. Under such conditions, the plasma of silicon oxide can be introduced in between the electrode surface and the vessel wall. Since the electric field intensity distribution is constant there, the plasma concentration is constant and the silicon oxide deposits on the vessel wall in a uniform thickness for coating. In this way, a silicon oxide film with a constant thickness is formed.

The internal and external electrodes can be one respectively. Use of plural electrodes should preferably be avoided. When a plurality of electrodes are used, a uniform film can hardly be formed even with the CVD process. The present inventor has studied the reason from various standpoints. For example, a silicon oxide was coated by the CVD process in a way shown by FIG. 3 where a plurality of electrodes were located with a constant distance to the outer surface of a vessel; however, the film thickness did not become constant as explained later in Comparative Example. Furthermore, although coating while the vessel was rotated at a constant speed to give a uniform film thickness, the coated film did not have improved gas-interception.

The present inventor understood these phenomena as follows. The use of a plurality of electrodes intervenes the electric field intensity distribution by respective electrodes mutually causing the change of plasma concentration, by which the film thickness could not be so uniform as desired. The vessel rotation formed a mixture of films that were produced by different electric field intensities, hence a film of satisfactorily excellent gas-interception could not be formed.

According to the present invention; the CVD process is used. As for the CVD process, high-frequency, alternating current and direct current may be used.

The silicon oxide film formed in the present invention may have a refractive index of 1.4 to 1.5 and a thickness of 300 to 2000 Å. The film thickness not more than 300 Å does not always give a continuous film, and the coating not less than 2000 Å little improves the gas-interception and can cause undesirable film destruction by internal stress.

The materials used for the silicon oxide plasma production by CVD process according to the present invention can include: $SiH_4$ and $NO_x$ gas or oxygen gas; organic silicon compounds such as tetraethoxysilane (TEOS) and hexamaethyldisiloxane (HMDSO) combined with $NO_x$ gas or oxygen gas; and plasma auxiliary gas such as He or Ar gas.

The silicon oxide film formed in this way has excellent gas-interception effect and provides excellent vessels for ordinary applications.

The PVD process also may be used in the present invention.

A fifth characteristic of the present invention is that either surface of the vessel can be coated by the selection of the position of the ground connection electrode, inside or outside the vessel. Plural coatings by changing the position of ground connection electrode can give coatings on both inward and outward surfaces.

The silicon compounds used for the purpose of forming the silicon oxide film can be liquid monomers such as silane, vinylethoxysilane and phenylmethoxysilane.

The present invention also includes a process for coating a silicon oxide film, uniform in the film thickness, on a plastic vessel of three-dimensional shape, the plastic which can be a material that has a Tg higher than the coating temperature of the silicon oxide film. A high-frequency electrode can be placed on the surface side on which the coating can be not formed and the location of the high-frequency electrode is nearly constant in a distance, preferably, not more than 10 mm from the electrode surface to the vessel surface on which the coating is formed. An electrode for ground connection can be placed in the surface side on which the coating is formed and the location of the ground connection electrode can be nearly constant in a distance from the electrode surface to the vessel surface, which distance is, preferably, greater than the distance from the high-frequency electrode surface to the vessel surface on which the coating is formed. The polymeric film of the silicon compound can be formed on the vessel surface by introducing the plasma, which is formed by a low temperature plasma technique from an organic silicon compound comprising at least silicon, oxygen and carbon, in between the vessel surface and the ground connection electrode with a discharge gas pressure of, preferably, $3 \times 10^{-3}$ to $3 \times 10^{-2}$ torr. The plasma of the silicon oxide produced by CVD process can be then supplied to form a coating film of the silicon oxide onto the polymeric film of silicon compound film with a discharge gas pressure of, preferably, 0.0005 to 0.05 torr. The coating film may comprise two layers obtained by this process can have very high water vapor-interception effect where the permeation of water vapor is, preferably, not more than 0.1 $g/m^2 \cdot day$, in addition to excellent gas-interception.

When the polymeric film of silicon compound and the silicon oxide film are formed by installing the ground connection electrode and the high-frequency electrode, both films formed are uniform and the gas-interception is improved significantly.

The reason why such special effects are brought about by the two-layer lamination in this order has not been satisfactorily explained scientifically; however, the function and effect of the present invention are realized repeatedly.

The present inventor has understood that the gas-impermeability effect of the silicon oxide film is greatly brought about by the stable fixation of fine particles of the silicon oxide supplied to the coating substrate. That is, the supplied particles move on the plastic substrate, stabilize at the most stable position and then fixed. In this way, the presence of formed polymer film of the silicon compound containing silicon, carbon and oxygen on the plastic substrate makes the silicon oxide fine particles stabilized and fixed effectively. Thus, the particle distribution is made uniform, and intimate coating is understood to be formed by further overlaying of the silicon oxide fine particles on the stabilized silicon oxide particles.

As for the fact that the water vapor-interception is very excellent as low as 0.1 $g/m^2 \cdot day$ or less when the first layer of polymeric film of silicon compound and the second layer of silicon oxide film are within specified range of the refractive index respectively, the present inventor has understood that these conditions result in intimate coating with higher fixation and less defect.

The first coating layer of polymeric film of silicon compound can be the film of 50 to 500 which gives a composition of 15% or more of silicon and 20% or more of carbon, the remaining being oxygen, in the first layer. When the coating layer is thicker than specified above, the gas-impermeability can be deteriorated. The special first coating layer of polymeric film of silicon compound may be formed by, for example, turning an organic silicon compound such as hexamethyldisiloxane into plasma and polymerizing the compound on the plastic substrate. The refractive index of coated film can be made 2.0 to 2.3 by adjusting the gas pressure to $3 \times 10^{-3}$ through $3 \times 10^{-2}$ torr in the polymerization step.

The plasma CVD process according to the present invention is clearly special in view of the fact that the discharge gas pressure in known plasma CVD processes ranges from several torr to several tens torr although the application purposes are different.

Examples of the organic silicone compound monomer to be used in the present invention include vinyltriethoxysilane, vinyltrimethoxysilane, tetramethoxysilane, tetraethoxysilane, phenyltrimethoxysilane, octamethylcyclotetrasiloxane, methyltrimethoxysilane, methyltriethoxysilane, 1, 1, 3, 3-tetramethyldisiloxane and hexanemethyldisiloxane. These compounds can also be used for forming the silicon oxide film.

The present invention also relates to a three-dimensional vessel of gas-interception which is coated with the silicon oxide film formed in this way. The vessel to be used is preferably formed from a plastic material that has a higher Tg than the coating temperature. Examples of such plastic include polyester resins such as PEN and PET, polycarbonate resins, and cyclic olefin copolymer resins. Vessels of high gas-interception can be obtained by providing a silicon oxide ($SiO_x$: x=1.5–2.0) film that has, preferably, a refractive index of 1.4 to 1.5 and a thickness of 300 to 2000 Å on the surface of three-dimensional vessels made from such plastic.

The present invention also includes a plastic vessel which is provided with the coated polymeric film of silicon compound, as the first layer, having, preferably, a refractive index of 2.0 to 2.3 and a thickness of 50 Å to 500 Å on the surface, and is provided thereon with the coated film of silicon oxide mentioned above. The silicon oxide film can also include a film coated with a mixture of silicon monoxide and silicon dioxide by PVD process.

Furthermore, the silicon oxide film may be comprises not less than 60% of silicon oxide and the rest of a metal compound such as $TiO_2$, MgO, $MgF_2$ and $CUCO_3$. Such mixture films have a large bending strength. When the content of silicon oxide is less than 60%, the gas-interception will deteriorate.

The present invention, will be further understood from the following examples which are illustrative.

EXAMPLE 1

Figure 1:
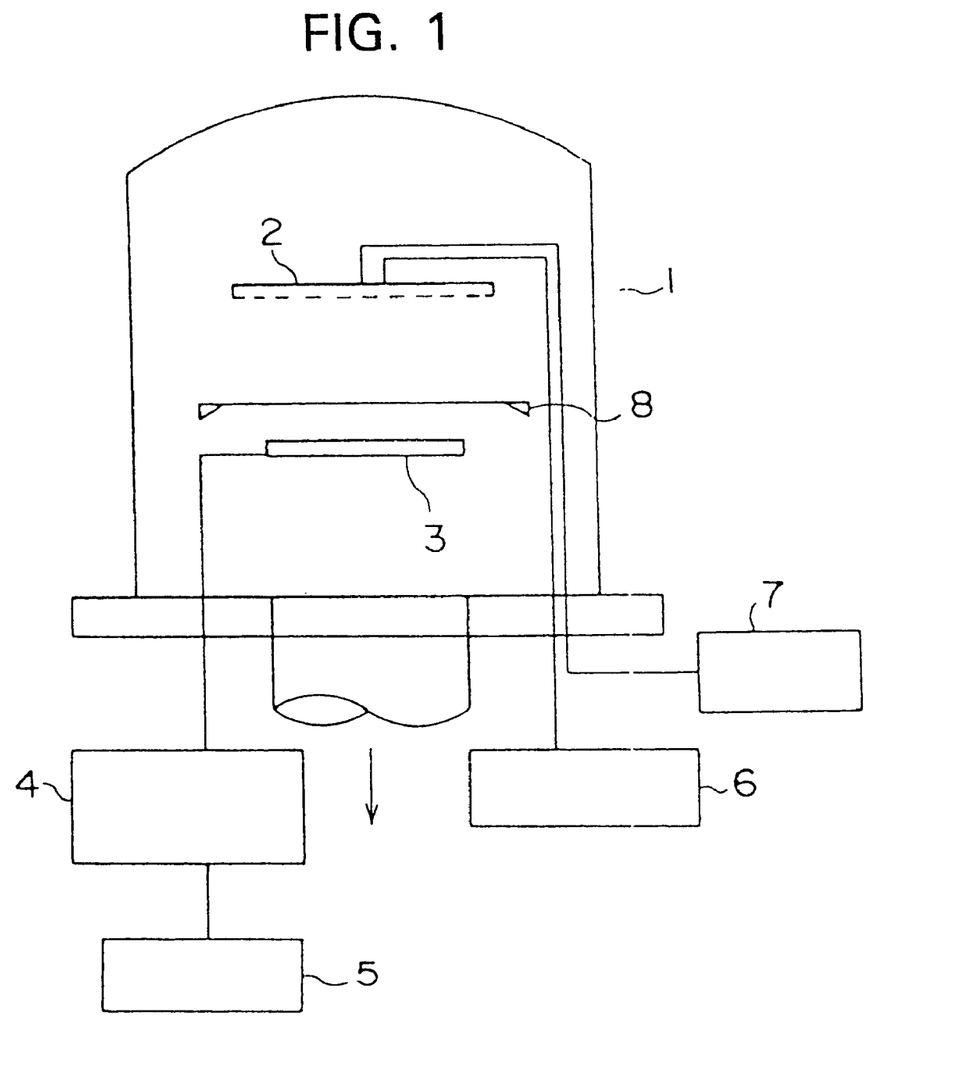
FIG. 1 is a schematic drawing of a high-frequency CVD apparatus used in the present invention.

FIG. 1 shows a high-frequency plasma CVD apparatus that was used in the present invention for forming the polymeric film of silicon compound. This apparatus comprises: a bell-jar type vacuum chamber 1, made of stainless steel, of 60 cm diameter that has an inlet 6 from which silane or monomer which is liquid at room temperature is introduced in gaseous condition, and has an inlet 7 for oxygen gas; high-frequency power source 5 (13.56 MHz, 1.5 kW, JEF-01B) made by JEOL Ltd. and a matching box 4; a high-frequency electrode 3 of a disc type of 13 cm diameter; a cylindrical ground connection electrode 2 of 20 cm diameter and 1.5 cm height; and a jig 8 for the sample located between both electrodes. The apparatus of FIG. 1 can coat both the polymeric film of silicon compound and the silicon oxide which is the gas-interception layer.

An oil-sealed rotary vacuum pump and an oil diffusion pump were used as vacuum pumps, which were being operated during the steps of film formation.

Hexamethyldisiloxane (hereinafter abbreviated as HMDSO) was used as the monomer which is liquid at room temperature. Oxygen gas was used as the reactive gas. These gases were introduced through separate routes, mixed in the ground connection electrode, and released into the chamber.

The ground connection electrode and the nigh-frequency electrode were placed in parallel with a distance of 70 mm. A polycarbonate hereinafter abbreviated as PC) sheet of 100 was used as the sample and placed with the aid of an insulating sample jig between the high-frequency electrode and ground connection electrode with a distance of 5 mm from the high-frequency electrode.

Vacuum in the chamber was made to $2–3\times10^{-5}$ torr (ionization vacuum gauge) by the oil-sealed rotary vacuum pump and oil diffusion pump, then oxygen gas was introduced until the vacuum became $1\times10^{-3}$ torr. Thereafter, HMDSO vapor was introduced until the vacuum became $2\times10^{-3}$ torr. Incident electric power of 200 W was introduced from the high-frequency power source through the matching box into the chamber, where the mixed plasma of oxygen and HMDSO was generated and kept for 10 minutes; thereby, a silicon oxide film is formed on the PC sample.

Water vapor permeability was determined for this laminate material using a water vapor permeability meter made by Mocon. The results are shown in Table 1.

EXAMPLE 2 AND COMPARATIVE EXAMPLE 1

Example 1 was repeated except the position of the PC sample placed between the high-frequency electrode and the ground connection electrode was changed to 3, 7, 9, 23, and 40 mm respectively from the high-frequency electrode. The water vapor permeation of the PC samples on which silicon oxide film was formed was determined and shown in Table 1 also.

TABLE 1

|  | Distance of HFE-Substrate (mm) | Water Vapor permeation $g/m^2 \cdot day$ |
| --- | --- | --- |
| Ex. 1 | 5 | 0.07 |
| Ex. 2 | 0 | 0.10 |
|  | 3 | 0.09 |
|  | 7 | 0.07 |
|  | 9 | 0.10 |
| CEx. 1 | 23 | 1.3 |
|  | 40 | 3.1 |

(Note):
HFE: Hight-frequency electrode
CEx: Comarative example

EXAMPLE 3 AND COMPARATIVE EXAMPLE 2

Example 1 was repeated except that the sample thickness was 180μ–280μ and that a plastic sheet having a glass transition temperature (hereinafter abbreviated as Tg) of −15° C. to 105° C. was used. The water vapor permeation of the samples on which silicon oxide film was formed was determined and shown in Table 2 The temperature of sample surface was measured by a optical fiber type thermometer and found to be 45° C. in this condition.

TABLE 2

|  | Tg of Substrate (° C.) | Water Vapor permeation $g/m^2 \cdot day$ |
| --- | --- | --- |
| Ex. 3 | 125 | 0.03 |
|  | 115 | 0.04 |
|  | 105 | 0.03 |
|  | 97 | 0.04 |
|  | 91 | 0.08 |
|  | 67 | 0.1 |
| CEx. 2 | −15 | 0.4 |

EXAMPLE 4

Figure 2:
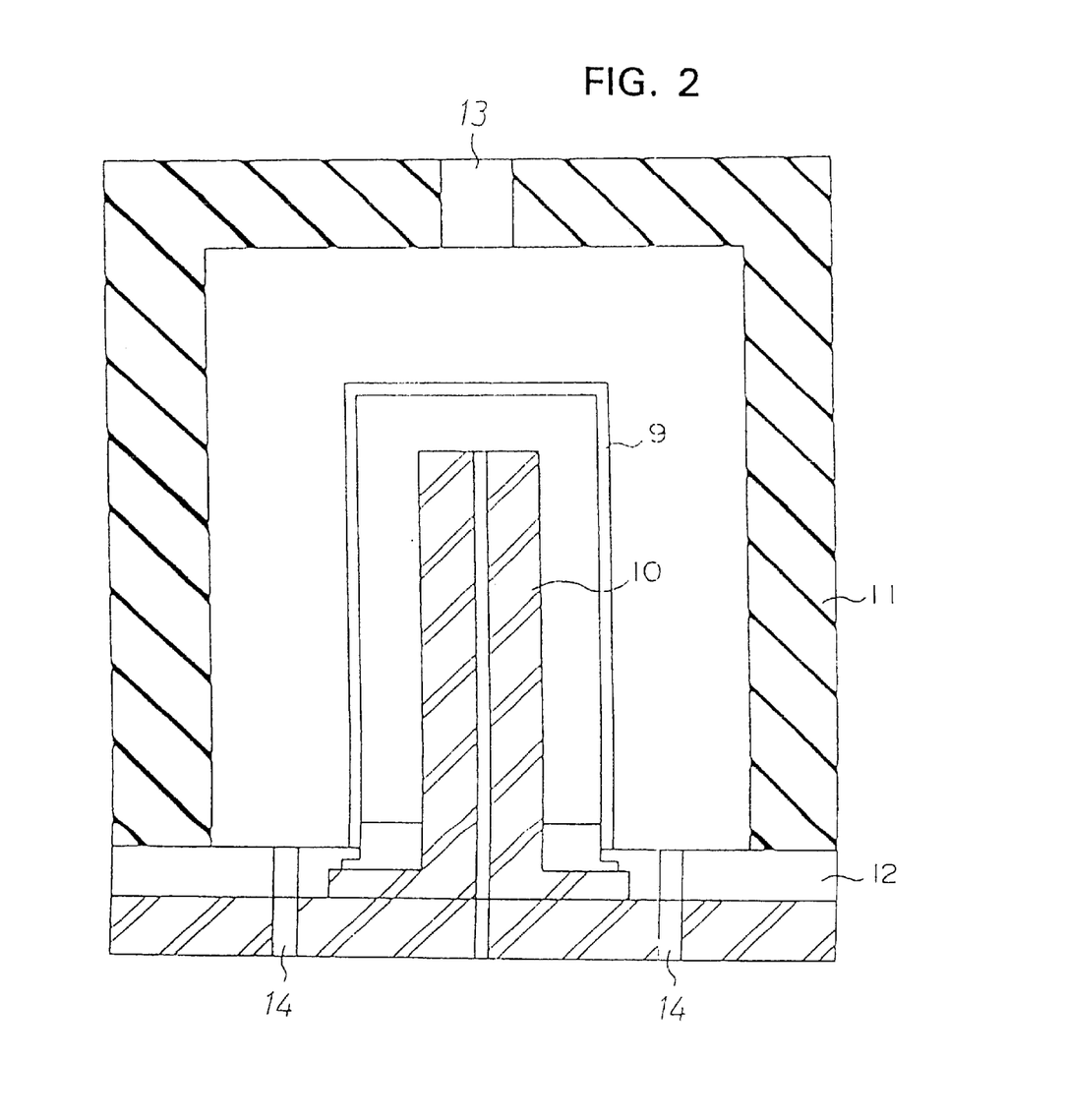
FIG. 2 is a schematic drawing of an apparatus for coating outer surface of a vessel used in the present invention.

FIG. 2 is a schematic cross-sectional drawing of an electrode for coating outer surface of a vessel used in the present invention. Reference numeral 9 in the drawing indicates a cylindrical vessel, provided with bottom, made of polyethylene terephthalate (hereinafter abbreviated as PET). Reference numeral 10 indicates the inner high-frequency electrode of which outer surface has similar shape to the outer surface of the cylindrical vessel provided with bottom. The distance between the outer surface of electrode 10 and the outer surface of the vessel is constant and about 5 mm. Reference numeral 11 indicates the external ground connection electrode. The inner surface of electrode 11 has similar shape to the outer surface of the cylindrical vessel 9 provided with bottom, and the distance between both is nearly constant and about 12 mm. Ground connection electrode 11 and high-frequency electrode 10 are placed through insulator 12. The ground connection electrode 11 has a gas inlet 13 at upper part. The electrode for coating outer surface has a gas outlet 14 at lower part. The reactive gas and the monomer gas are introduced into the electrode through the gas inlet 13, turned to plasma, allowed to flow along the outer surface of the cylindrical vessel 9 provided with bottom, and exhausted outward from the electrode through the gas outlet 14. With this electrode, the silicon oxide film is formed on the outer surface of the cylindrical vessel 9 provided with bottom.

By use of the apparatus shown in FIG. 1 with the electrode for coating outer surface of vessel that was equipped with the cylindrical vessel 9 provided with bottom, a silicon oxide film was formed on the outer surface of a vessel.

The silicon oxide film was formed by the following arrangement. The jig 8 for sample in FIG. 1 was removed; the electrode for coating outer surface for the vessel of FIG. 2 was placed between the high-frequency electrode 3 and the ground connection electrode 2 in FIG. 1; the cylindrical ground connection electrode 2 and the ground connection electrode 11 of the electrode for coating outer surface of the vessel were connected; and the disc high-frequency electrode 3 and the high-frequency electrode 10 for coating outer surface of the vessel were connected.

Vacuum in the chamber was made to $2–3\times10^{-5}$ torr (ionization vacuum gauge) by an oil-sealed rotary vacuum pump and oil diffusion pump, then oxygen gas was introduced until the vacuum became $1\times10^{-3}$ torr. Thereafter, HMDSO vapor was introduced until the vacuum became $2\times10^{-3}$ torr. Incident electric power of 200 W was introduced from the high-frequency power source through the matching box into the chamber, where the mixed plasma of oxygen and HMDSO was generated and kept for 10 minutes; thereby, a silicon oxide film was formed on the outer surface of the cylindrical vessel provided with bottom.

The thickness distribution of the silicon oxide film and the water vapor permeability were determined for the barrel part of the cylindrical vessel provided with bottom. The results are shown in Table 3.

COMPARATIVE EXAMPLE 3

Figure 3:
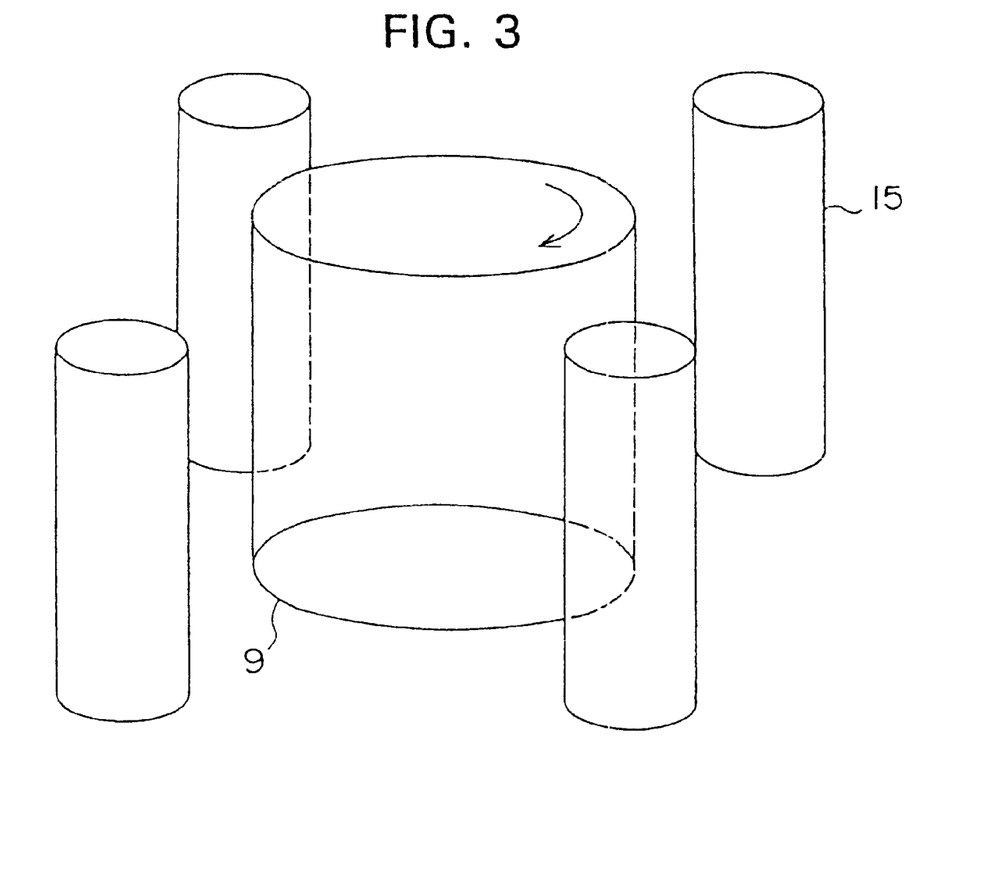
FIG. 3 is a schematic drawing of a Comparative Example.

Outside of the cylindrical vessel 9 provided with bottom of Example 4, four external high-frequency electrodes 15 were placed, as shown in FIG. 3, with equal 90 degrees angle in terms of the cylinder centers and equal distance from the outer surfaces of the cylindrical vessels. Except this, coating was performed in the same conditions as Example 4. The thickness distribution of the silicon oxide film and the water vapor permeability were determined for the barrel part of the cylindrical vessel provided with bottom. The result is shown in Table 3 together with Example 4.

Figure 4:
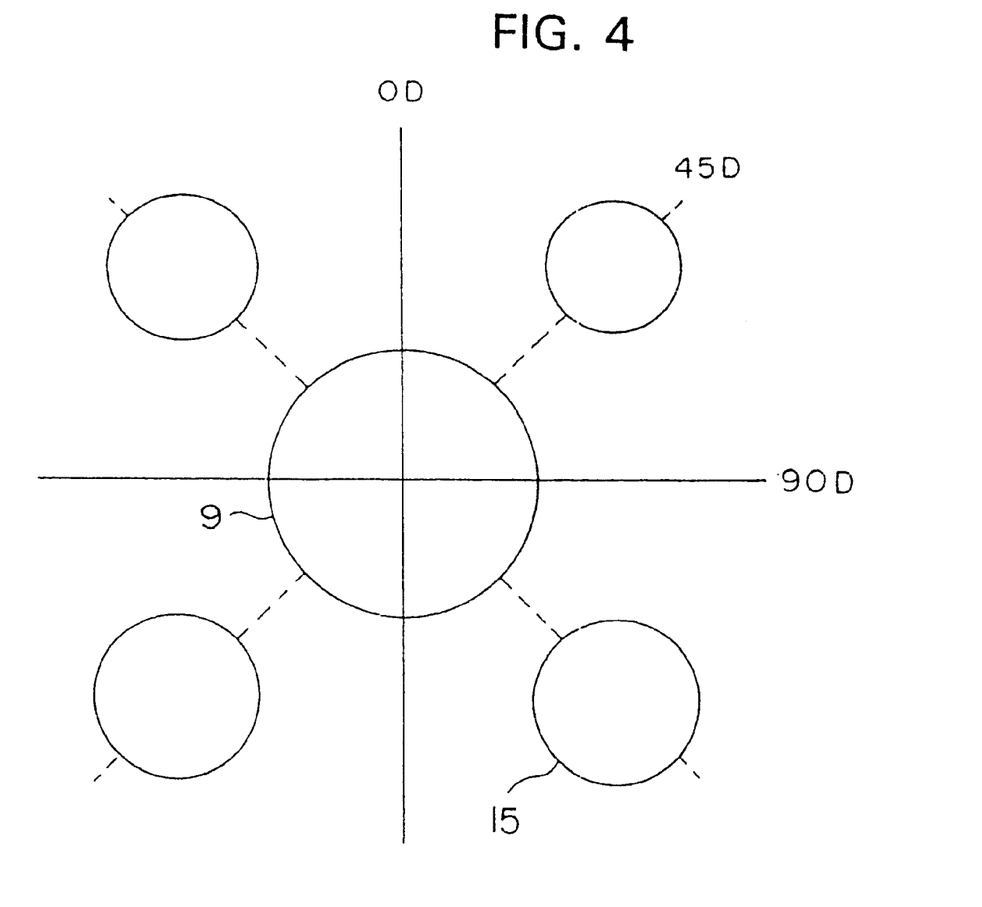
FIG. 4 is a drawing showing the observation position of the apparatus shown by FIG. 3.

FIG. 4 is a schematic top view of the coating apparatus of FIG. 3, in which the observed positions 0D, 45D, and 90D are indicated.

COMPARATIVE EXAMPLE 4

Coating was performed in the same conditions as in Example 4 except cylindrical vessel provided with bottom was axially rotated at 4 rpm. The thickness distribution of the silicon oxide film and the water vapor permeability were determined for the barrel part of the cylindrical vessel provided with bottom. The results are shown in Table 3 together with Example 4 and Comparative Example 3.

TABLE 3

| Observed Position | Film Thickness (Å) | | | Refractive Index | | | Water Vapor permeation g/m² · day |
|---|---|---|---|---|---|---|---|
| | 0D | 45D | 90D | 0D | 45D | 90D | |
| Ex. 4 | 950 | 980 | 930 | 1.45 | 1.47 | 1.44 | 0.02 |
| CEx. 3 | 510 | 1680 | 620 | 1.42 | 1.69 | 1.44 | 1.85 |
| CEx. 4 | 940 | 990 | 950 | 1.55 | 1.60 | 1.58 | 1.05 |

EXAMPLE 5

Figure 5:
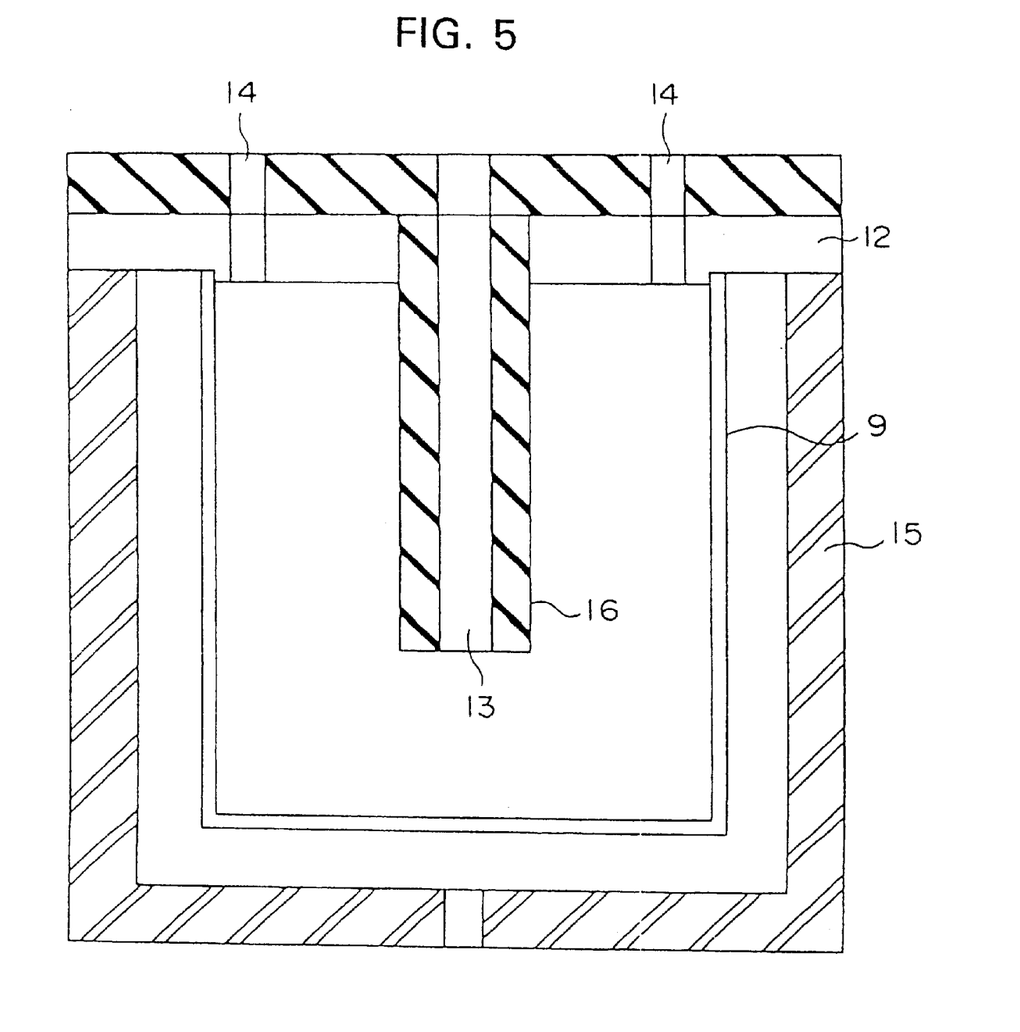
FIG. 5 is a schematic drawing of an apparatus for coating inner surface of a vessel used in the present invention.

FIG. 5 is a schematic cross-sectional drawing of an electrode for coating inner surface of a vessel used in the present invention. Reference numeral 9 in the drawing indicates a vessel in a cup shape, made of a cyclic olefin copolymer (hereinafter abbreviated as COC). Reference numeral 15 indicates the outer high-frequency electrode of which inner surface has similar shape to the inner surface of the cup vessel. The distance between the inner surface of electrode 15 and the inner surface of the vessel is constant and about 5 mm. Reference numeral 16 indicates the internal ground connection electrode. The outer surface of electrode 16 has similar shape to the inner surface of the cup vessel 9, and the distance between both is nearly constant and about 20 mm. Ground connection electrode 16 and high-frequency electrode 15 are placed through insulator 12. The ground connection electrode 16 has a gas inlet 13 at lower part and a gas outlet 14 at upper part. The reactive gas and the monomer gas are introduced into the electrode through the gas inlet 13, turned to plasma, allowed to flow along the inner surface of the cup vessel 1, and exhausted outward from the electrode through the gas outlet 14. With this electrode, the silicon oxide film is formed on the inner surface of the cup vessel 9.

By use of the apparatus shown in FIG. 1 with the electrode for coating inner surface of vessel that was equipped with the cup electrode, a silicon oxide film was formed on the inner surface of a vessel.

The silicon oxide film was formed by the following arrangement. The jig 8 for sample in the drawing was removed; the electrode for coating inner surface for the vessel of FIG. 5 was placed between the high-frequency electrode 3 and the ground connection electrode 2 in FIG. 1; the cylindrical ground connection electrode 2 and the ground connection electrode 16 of the electrode for coating inner surface of the vessel were connected; and the disc high-frequency electrode 3 and the high-frequency electrode 15 for coating inner surface of the vessel were connected. Thereafter, $SiH_4$ gas was introduced through the monomer inlet and oxygen was introduced through the oxygen gas inlet. Then, the mixed plasma of these gases was generated. A silicon oxide film was deposited on the inner surface of the cup vessel with a discharge pressure of $2 \times 10^{-3}$ torr. The water vapor permeability of cup vessel coated with the silicon oxide film was determined and found to be 0.02 g/m²·day (40° C., 90% RH).

EXAMPLE 6

A cylindrical vessel, provided with bottom, made of polyethylene naphthalate (hereinafter abbreviated as PEN) was coated on the outer surface with a HMDSO polymer film and a silicon oxide film by use of the apparatus shown in FIG. 2 where the electrode for coating outer surface of the vessel was provided.

Except for the conditions described below, the coating was performed in the same conditions as Example 4.

Vacuum in the chamber was made to $2-3 \times 10^{-5}$ torr (ionization vacuum gauge) by an oil-sealed rotary vacuum pump and oil diffusion pump. Thereafter, HMDSO vapor was introduced until the vacuum became $3 \times 10^{-3}$ torr to $1 \times 10^{-3}$ torr. Incident electric power of 400 W was introduced from the high-frequency power source into the chamber, where HMDSO plasma was generated and kept for 1 minute; thereby, a HMDSO polymer film is formed on the outer surface of the cylindrical vessel provided with bottom.

Subsequently, the vacuum in chamber was made to $2-3 \times 10^{-5}$ torr by the oil-sealed rotary vacuum pump and oil diffusion pump, then a silicon oxide film is formed in the same manner as Example 5 on the HMDSO polymer film. The cylindrical vessel provided with bottom coated with these films were subjected to analysis in which the refractive index and the film thickness were determined by an ellipsometer and the water vapor permeation was determined by weight method. The results are shown in Table 4.

TABLE 4

| | HMDSO | | HMDSO Film | | Water Vapor Permeation |
|---|---|---|---|---|---|
| | Conc. | Coating Period | Refractive Index | Film Thickness | through two-layer film |
| Ex.6 | 3 | 0.5 min | 2.05 | 60 | 0.04 |
| | 3 | 1.0 min | 2.05 | 100 | 0.03 |
| | 3 | 2.0 min | 2.05 | 210 | 0.05 |

TABLE 4-continued

| HMDSO | | HMDSO Film | | Water Vapor Permeation |
|---|---|---|---|---|
| Conc. | Coating Period | Refractive Index | Film Thickness | through two-layer film |
| 8 | 0.5 min | 2.25 | 80 | 0.02 |
| 8 | 1.0 min | 2.25 | 150 | 0.02 |
| 8 | 2.0 min | 2.25 | 320 | 0.03 |
| 10 | 0.5 min | 2.04 | 120 | 0.05 |
| 10 | 1.0 min | 2.04 | 240 | 0.06 |
| 10 | 2.0 min | 2.04 | 480 | 0.08 |

(Note):
Unit of HMDSO concentration (conc.): $\times 10^{-3}$ torr
Unit of film thickness: Angstrom
Unit of water vapor permeation: $g/m^2 \cdot day$ at 40° C., 90% RH

COMPARATIVE EXAMPLE 5

Coating was made in the same way as Example 6 on on the same cylindrical PEN vessel with bottom except that the HMDSO concentration was $1.5 \times 10^{-3}$ torr and $20 \times 10^{-3}$ torr and that the time of coating period of the HMDSO polymer film was 0.2 and 5 minutes. The refractive index and the film thickness of the HMDSO polymer film coated on the outer surface of the vessel were determined by an ellipsometer. The water vapor permeation was determined by weight method for the HMDSO laminated polymer film and silicon oxide film. The results are shown in Table 5.

TABLE 5

| | HMDSO | | HMDSO Film | | Water Vapor Permeation through |
|---|---|---|---|---|---|
| | Conc. | Coating Period | Refractive Index | Film Thickness | two-layer film |
| CEx. 5 | 2 | 0.2 min | 1.78 | 30 | 0.15 |
| | 2 | 5 min | 1.78 | 770 | 0.45 |
| | 20 | 0.5 min | 1.68 | 300 | 0.32 |
| | 20 | 5 min | 1.66 | 6000 | 0.47 |
| Uncoated | | | | | 0.49 |

(Note):
Unit of HMDSO concentration (cono.): $\times 10^{-3}$ torr
Unit of HMDSO polymer film thickness: Angstrom
Unit of water vapor permeation through two-layer film: $g/m^2 \cdot day$ at 40° C., 90% RH

EXAMPLE 7

A cylindrical vessel, provided with bottom, made of polyethylene naphthalate (hereinafter abbreviated as PEN) was coated on the outer surface with a HMDSO polymer film and a silicon oxide film by use of the apparatus shown in FIG. 2 where the electrode for coating outer surface of the vessel was provided.

Except the cylindrical vessel provided with bottom and the conditions described below, the coating was performed in the same conditions as Example 4.

Vacuum in the chamber was made to $2-3 \times 10^{-5}$ torr (ionization vacuum gauge) by an oil-sealed rotary vacuum pump and oil diffusion pump, then HMDSO vapor was introduced until the vacuum became $4 \times 10^{-3}$ torr. Incident electric power of 400 W was introduced from the high-frequency power source into the chamber, where HMDSO plasma was generated and kept for 1 minute; thereby, a HMDSO polymer film is formed on the outer surface of the cylindrical vessel provided with bottom.

Subsequently, the vacuum in chamber was made to $2-3 \times 10^{-5}$ torr by the oil-sealed rotary vacuum pump and oil diffusion pump, then a silicon oxide film is formed in the same manner as Example 5 on the HMDSO polymer film except that the concentration of HMDSO vapor to oxygen (HMDSO/oxygen; the ratio of vacuum in the chamber as determined by ionization vacuum gauge) was in a range from 0.5 to 2.5 and that the time of coating period of the HMDSO polymer film was 5 to 20 minutes. The cylindrical vessel provided with bottom coated with these films were subjected to analysis in which the refractive index and the film thickness were determined by an ellipsometer and the water vapor permeation was determined by weight method. The results are shown in Table 6.

TABLE 6

| | HMDSO/ $O_2$ Ratio | Coating period of Si oxide | Si oxide film | | Water vapor permeation |
|---|---|---|---|---|---|
| | | | Refractive Index | Film Thickness | through two-layer film |
| Ex. 7 | 0.5 | 5.0 min | 1.43 | 510 | 0.03 |
| | 0.5 | 10.0 min | 1.44 | 1060 | 0.02 |
| | 0.5 | 20.0 min | 1.44 | 1880 | 0.02 |
| | 1.0 | 5.0 min | 1.45 | 490 | 0.02 |
| | 1.0 | 10.0 min | 1.45 | 1080 | 0.02 |
| | 1.0 | 20.0 min | 1.46 | 2010 | 0.02 |
| | 2.5 | 5.0 min | 1.46 | 520 | 0.03 |
| | 2.5 | 10.0 min | 1.46 | 1050 | 0.04 |
| | 2.5 | 20.0 min | 1.46 | 2030 | 0.05 |

(Note):
Unit of Coating period of Si oxide: Minutes
Unit of film thickness: Angstrom
Unit of water vapor permeation through two-layer film: $g/m^2 \cdot day$ at 40° C., 90% RH The volumetric ration of organic silicon to oxygen can be calculated from Example 7 by converting the ratios of organic silicon to oxygen into corresponding volumetric ratios. The relative sensitivity of organic silicon and oxygen using an ionization gauge is accomplished by first drawing a vacuum in the vacuum chamber to $1 \times 10^{-5}$ torr, and using a first mass flow meter to introduce a predetermined amount of oxygen into the chamber, and measuring the degree of vacuum in the chamber using the ionization gauge. Upon closing the first gas flow meter, the vacuum in the chamber is drawn down to $1 \times 10^{-5}$ torr again, and a predetermined amount of HMDSO gas is introduced into the chamber using a second flow meter. The degree of vacuum is again measured using an ionization gauge. By knowing the amount of gas introduced and calibrating the ionization gauge in this manner, the difference in sensitivity between the gases becomes the ratio between the two gases at the same degree of vacuum. For example, if the amount of oxygen first introduced if 9.5 sccm with a degree of vacuum of $1 \times 10^{-3}$ torr, and the amount of organic silicon introduced second is 0.86 with a degree of vacuum of $1.0 \times 10^{-3}$ torr, then the sensitivity of oxygen and organic silicon is $(9.5)/(0.86)=11$ at $1 \times 10^{-3}$ torr. In this manner the sensitivity of the ionization gauge is determined for oxygen and HMDSO. These sensitivities can then be used to convert the ionization gauge reading ratios to volume ratios. Using this sensitivity factor allows ready conversion of the measured ionization gauge reading to volume ratio of organic silicon to oxygen by dividing by the sensitivity. For example, when the ionization gauge reads 0.5, volume ratio is $(0.5)/(11)=0.045$. When the ionization gauge reades 2.5, the volume ration is $(2.5)/(11)=0.23$.

COMPARATIVE EXAMPLE 6

Coating of silicon oxide film was formed on the HMDSO polymer film in the same way as Example 7 except that the concentration of HMDSO vapor to oxygen (HMDSO/oxygen; the ratio of vacuum in the chamber as determined by ionization vacuum gauge) was 0.2 and 5 and that the time of coating period of the HMDSO polymer film was 2 to 25 minutes. The cylindrical vessel provided with bottom coated with these films were subjected to analysis in which the refractive index and the film thickness were determined by an ellipsometer and the water vapor permeation was determined by weight method. The results are shown in Table 7.

TABLE 7

| | HMDSO/ $O^2$ Ratio | Coating period of Si oxide | Si oxide film Refractive Index | Si oxide film Film Thickness | Water vapor permeation through two-layer film |
|---|---|---|---|---|---|
| CEx. 6 | 0.2 | 2 min | 1.38 | 180 | 0.46 |
| | 0.2 | 25 min | 1.39 | 2350 | 0.14 |
| | 5.0 | 2 min | 1.59 | 190 | 0.48 |
| | 5.0 | 25 min | 1.60 | 2530 | 0.25 |
| Uncoated | | | | | 0.49 |

(Note):
Unit of Coating period of Si oxide: Minutes
Unit of film thickness: Angstrom
Unit of water vapor permeation through two-layer film: g/m² · day at 40° C., 90% RH Since a silicon oxide film of uniform thickness and of a refractive index in a constant range is formed on a three-dimensional plastic vessel, a vessel of excellent gas-interception can be provided according to the present invention.

What is claimed is:

1. A plastic vessel of three-dimensional shape, that is coated with a silicon oxide film, wherein said plastic is a material that has a Tg higher than the coating temperature; and said silicon oxide film has a refractive index of 1.4 to 1.5, and a composition of $SiO_x$ wherein x=1.5 to 2.0, wherein between the silicon oxide film and the plastic vessel is a silicon compound polymeric film comprising silicon, oxygen, carbon and hydrogen, that has a refractive index of 2.0 to 2.3: and wherein the silicon oxide film is formed by using a volume ratio of organic silicon to oxygen of 0.045 to 0.23.

2. A plastic vessel of three-dimensional shape, according to claim 1, wherein the plastic material is a polyester resin.

3. A plastic vessel of three-dimensional shape, according to claim 1, wherein the plastic material is a polycarbonate.

4. A plastic vessel of three-dimensional shape, according to claim 1, wherein the plastic material is a resinous copolymer of a cyclic olefin.

5. A plastic vessel of three-dimensional shape, according to claim 1, wherein the silicon oxide film is formed by DVD process.

6. A plastic vessel of three-dimensional shape, according to claim 1, wherein the silicon oxide film that contains not less than 60% of silicon oxide compounds.

* * * * *